(12) United States Patent
Yun et al.

(10) Patent No.: US 9,252,129 B2
(45) Date of Patent: Feb. 2, 2016

(54) SEMICONDUCTOR APPARATUS

(75) Inventors: Tae Sik Yun, Icheon-si (KR); Sang Jin Byeon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 822 days.

(21) Appl. No.: 13/602,257

(22) Filed: Sep. 3, 2012

(65) Prior Publication Data

US 2013/0241314 A1  Sep. 19, 2013

(30) Foreign Application Priority Data

Mar. 13, 2012 (KR) ........................ 10-2012-0025391

(51) Int. Cl.
*H03K 19/00* (2006.01)
*H01L 25/065* (2006.01)
*H03K 19/003* (2006.01)
*G01R 31/28* (2006.01)

(52) U.S. Cl.
CPC ...... *H01L 25/0657* (2013.01); *H03K 19/00369* (2013.01); *G01R 31/2882* (2013.01); *H01L 2224/16* (2013.01); *H01L 2224/16145* (2013.01); *H01L 2225/06513* (2013.01); *H01L 2225/06544* (2013.01); *Y10T 307/826* (2015.04)

(58) Field of Classification Search
None
See application file for complete search history.

(56) References Cited

U.S. PATENT DOCUMENTS 8,369,122 B2 * 2/2013 Byeon et al. .................... 365/51
2012/0194243 A1 * 8/2012 Choi et al. ..................... 327/161
2014/0247683 A1 * 9/2014 Riho ........................... 365/233.1

* cited by examiner

*Primary Examiner* — Anh Tran
(74) *Attorney, Agent, or Firm* — William Park & Associates Ltd.

(57) ABSTRACT

A semiconductor apparatus includes: a slave chip including a signal transfer unit configured to determine whether or not to transfer an input signal in response to a chip select signal; a master chip including a replica circuit unit having the same configuration as the signal transfer unit and a signal output unit configured to receive an output signal of the signal transfer unit and an output signal of the replica circuit unit and generate an output signal in response to the control signal; a first through-chip via vertically formed through the slave chip, and having one end connected to the master chip to receive the input signal and the other end connected to the signal transfer unit; and a second through-chip via vertically formed through the slave chip, and having one end connected to the signal transfer unit and the other end connected to the signal output unit.

15 Claims, 3 Drawing Sheets

SEMICONDUCTOR APPARATUS

CROSS-REFERENCES TO RELATED APPLICATION

The present application claims priority under 35 U.S.C. §119(a) to Korean application number 10-2012-0025391, filed on Mar. 13, 2012, in the Korean Intellectual Property Office, which is incorporated herein by reference in its entirety.

BACKGROUND

1. Technical Field

The present invention relates generally to a semiconductor integrated circuit, and more particularly, to a three-dimensional (3D) semiconductor apparatus.

2. Related Art

In order to meet high integration demands for semiconductor devices, a 3D semiconductor apparatus including a plurality of chips stacked and packaged inside a single package has been developed. Since the 3D semiconductor apparatus includes two or more chips stacked in a vertical direction, the higher integration levels may be provided without utilizing additional space.

A variety of methods may be applied to implement the 3D semiconductor apparatus. One of the methods is to stack a plurality of chips having the same structure and connect the stacked chips through a metallic wire such that the stacked chips operate as one semiconductor apparatus.

In particular, a chip stack method to form one semiconductor memory apparatus by stacking a plurality of semiconductor chips uses a through-chip via to transfer a signal in common to the plurality of semiconductor chips. In general, since a semiconductor chip is fabricated using a silicon wafer, the through-chip via may be referred to as a through-silicon via (TSV).

In general, a semiconductor apparatus using the TSV may include a master chip and a plurality of slave chips which are electrically connected to the master chip through the TSV. In the case of a memory apparatus, the master chip includes all logic circuits in a peripheral circuit area for the operation of the memory apparatus, and the slave chips include a memory core to store data and circuits for a core operation, thereby operating as one semiconductor apparatus.

Although the 3D semiconductor apparatus includes a plurality of chips stacked therein, the plurality of chips share a data input/output line, in order to operate as a single semiconductor apparatus. In a semiconductor apparatus using wire connection, data outputted from a plurality of chips stacked therein may be transferred to a controller through one input/output line. In a semiconductor apparatus using a TSV, data of slave chips may be transferred to a master chip, and then outputted to the outside through a pad provided in the master chip. However, the semiconductor apparatus using a TSV has different signal transfer times and different driving abilities throughout the device, depending on the diameter and length of the TSV, thereby causing different performance levels among the individual chips. Therefore, it is necessary to measure a signal transfer time through the TSV.

FIG. 1 is a diagram schematically illustrating the configuration of a conventional 3D semiconductor apparatus 10.

Referring to FIG. 1, the 3D semiconductor apparatus 10 includes a plurality of chips 11 to 13, a plurality of TSVs 14 to 17 formed through the respective chips 11 to 13, a plurality of connection pads BP1 and BP2 provided between the respective TSVs 14 to 17 and electrically connecting the corresponding TSVs, a plurality of external connection terminals BALL1 and BALL2 to electrically connect the plurality of chips 11 to 13 to a substrate 20, and the substrate 20 electrically connected to the plurality of chips 11 to 13.

A TSV time delay measuring method of the conventional 3D semiconductor apparatus 10 is performed as follows: a total time delay is measured from where an input signal IN is transmitted to a specific external connection terminal to where the input signal IN is outputted to another external connection terminal, and is then divided by the number of TSVs 14 to 17 inside the 3D semiconductor apparatus 10, in order to calculate the time delay of each TSV.

However, the TSV time delay measuring method of the conventional 3D semiconductor apparatus 10 may not be accurate, since there is additional delay caused by the connection pads BP1 and BP2 or PVT (process, voltage, temperature) variation occurring in each chip while the input signal IN is transmitted.

SUMMARY

In an embodiment of the present invention, a semiconductor apparatus includes: a slave chip including a signal transfer unit configured to determine whether to transfer an input signal in response to a chip select signal; a master chip including a replica circuit unit having a similar configuration as the signal transfer unit and a signal output unit configured to receive an output signal of the signal transfer unit and an output signal of the replica circuit unit and generate an output signal in response to the control signal; a first through-chip via vertically formed through the slave chip, and having one end connected to the master chip to receive the input signal and the other end connected to the signal transfer unit; and a second through-chip via vertically formed through the slave chip, and having one end connected to the signal transfer unit and the other end connected to the signal output unit.

In another embodiment of the present invention, a semiconductor apparatus includes: a slave chip including having a signal transfer unit configured to determine whether to transfer an input signal in response to a chip select signal; a master chip including a replica circuit unit having the same configuration as the signal transfer unit, a signal path selection unit configured to transmit the input signal to the signal transfer unit or the replica circuit unit in response to a control signal, and a signal output unit configured to receive an output signal of the signal transfer unit and an output signal of the replica circuit unit and output an output signal in response to the control signal; a first through-chip via vertically formed through the slave chip, and having one end connected to the signal path selection unit and the other end connected to the signal transfer unit; and a second through-chip via vertically formed through the slave chip, and having one end connected to the signal transfer unit and the other end connected to the signal output unit.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to an embodiment of the present invention will be described below with reference to the accompanying drawings through various embodiments.

In general, a 3D semiconductor apparatus may include a master chip and a plurality of slave chips. The plurality of slave chips are used as memory storage devices, and the master chip is used to control the plurality of slave chips. In order to select a desired slave chip, different chip IDs are allocated to the master chip and the plurality of slave chips. After the chip IDs are allocated to the respective chips, a system including the semiconductor apparatus may input the chip select code to the semiconductor apparatus through a controller such that the semiconductor apparatus selects the desired chip.

Figure 1:
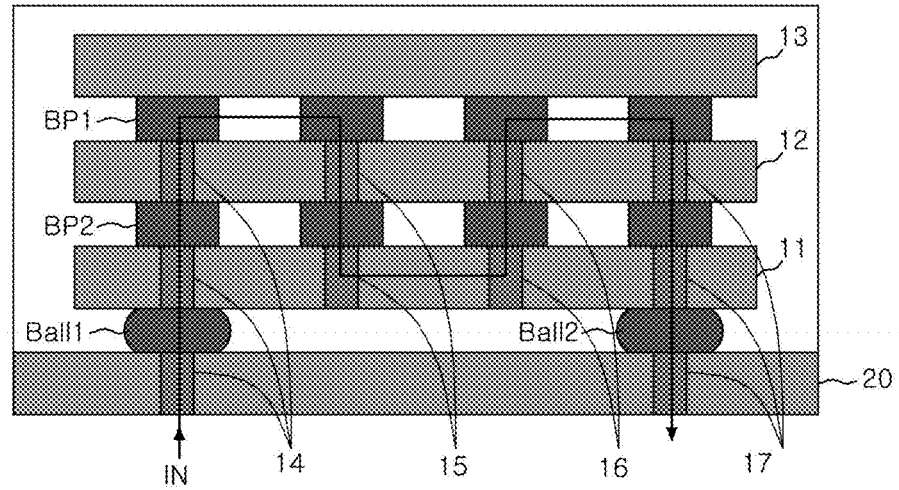
FIG. 1 is a diagram schematically illustrating the configuration of a conventional 3D semiconductor apparatus.
Figure 2:
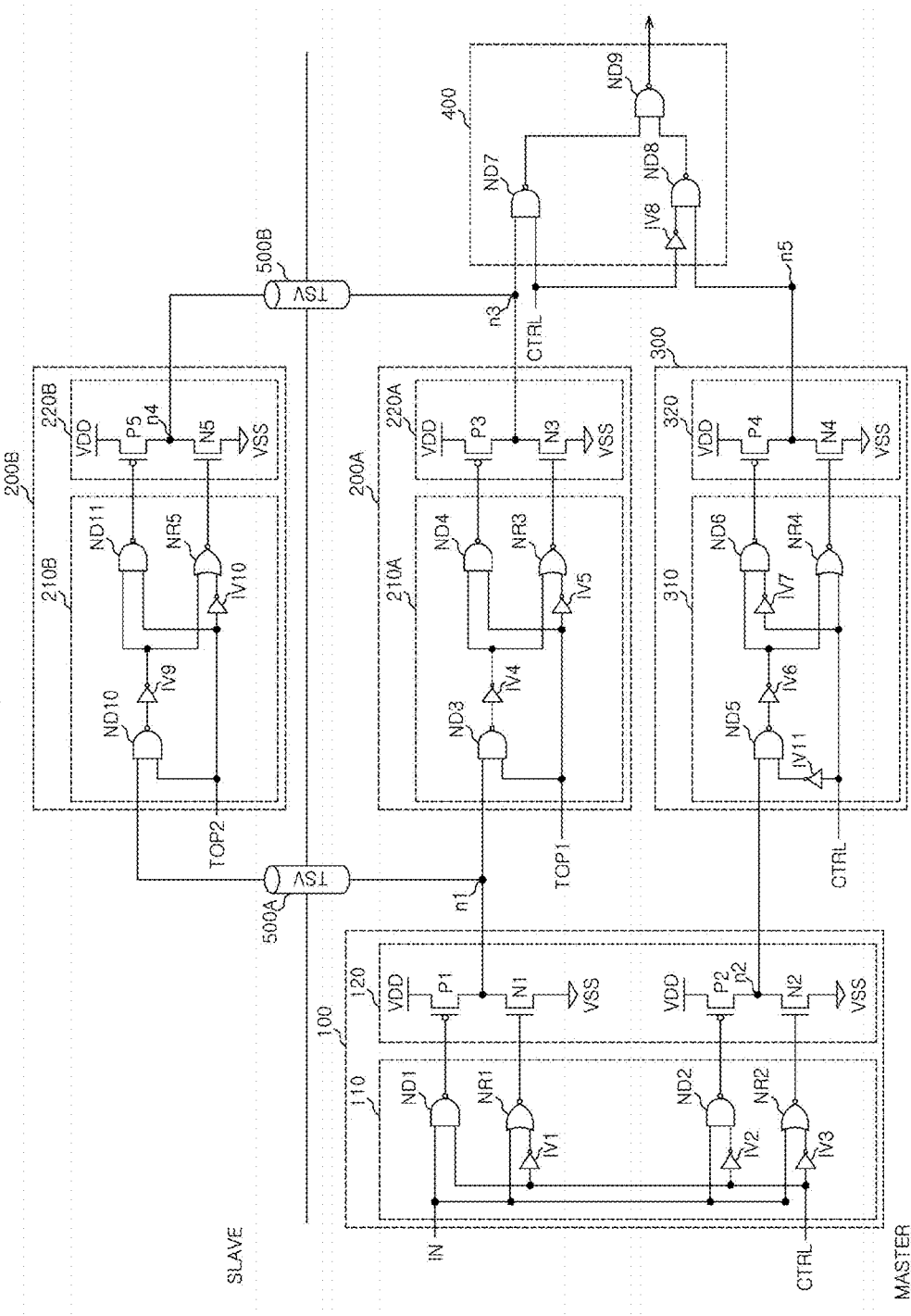
FIG. 2 is a circuit diagram of a through-chip via delay measuring circuit according to an embodiment of the present invention.

FIG. 2 is a circuit diagram of a through-chip via delay measuring circuit according to an embodiment of the present invention. The through-chip via may include a TSV.

Referring to FIG. 2, the through-chip via delay measuring circuit according to embodiments of the present invention includes a plurality of TSVs 500A and 500B, a signal path selection unit 100, a plurality of signal transfer units 200A and 200B, a replica circuit unit 300, and a signal output unit 400.

The signal path selection unit 100, the signal transfer unit 200A, the replica circuit unit 300, and the signal output unit 400 are included in a master chip, and the second transfer unit 200B is included in a slave chip.

The signal path selection unit 100 is configured to output an input signal IN to a first or second node n1 or n2 in response to a control signal CTRL. The first node n1 is connected to the first signal transfer unit 200A and the first TSV 500A, which in turn is connected to the second signal transfer unit 200B. The second node n2 is connected to the replica circuit unit 300. The control signal CTRL is generated using a test mode signal, and may be used to select a path to transmit the input signal IN to either the slave chip or the master chip.

The signal path selection unit 100 includes a first controller 110 and a first driver 120. The first controller 110 includes a first NAND gate ND1, a first inverter IV1, a first NOR gate NR1, a second inverter IV2, a second NAND gate ND2, a third inverter IV3, and a second NOR gate NR2. The first NAND gate ND1 is configured to perform a NAND operation on the input signal IN and the control signal CTRL. The first inverter IV1 is configured to invert and output the control signal CTRL. The first NOR gate NR1 is configured to perform a NOR operation on an output signal of the first inverter and the input signal IN. The second inverter IV2 is configured to invert and output the control signal CTRL. The second NAND gate ND2 is configured to perform a NAND operation on an output signal of the second inverter IV2 and the input signal IN. The third inverter IV3 is configured to invert and output the control signal CTRL. The second NOR gate NR2 is configured to perform a NOR operation on an output signal of the third inverter IV3 and the input signal IN.

The first driver 120 includes a first PMOS transistor P1, a first NMOS transistor N1, a second PMOS transistor P2, and a second NMOS transistor N2. The first PMOS transistor P1 is connected between a driving voltage terminal VDD and the first node n1 and configured to receive an output signal of the first NAND gate ND1. The first NMOS transistor N1 is connected between the first node n1 and a ground voltage VSS and configured to receive an output signal of the first NOR gate NR1. The second PMOS transistor P2 is connected between the driving voltage terminal VDD and the second node n2 and configured to receive an output signal of the NAND gate ND2. The second NMOS transistor N2 is connected between the second node N2 and the ground voltage VSS and configured to receive an output signal of the second NOR gate NR2.

The signal path selection unit 100 outputs the input signal IN to the first node n1 when the control signal CTRL is activated, and outputs the input signal IN to the second node n2 when the control signal CTRL is deactivated.

The first signal transfer unit 200A includes a second controller 210A and a second driver 220A, and is configured to determine whether to transfer the signal outputted from the signal path selection unit 100 to the signal output unit 400, in response to a first chip select signal TOP1.

The second signal transfer unit 200B includes a third controller 2106 and a third driver 220B. The second signal transfer unit 200B is configured to determine whether to transfer a signal inputted through the first TSV 500A to the second TSV 500B, in response to a second chip select signal TOP2.

The first and second chip select signals TOP1 and TOP2 are generated from chip IDs which are allocated to the plurality of semiconductor chips included in the semiconductor apparatus. Therefore, the number of chip select signals may correspond to the number of semiconductor chips included in the semiconductor apparatus. In this embodiment of the present invention, since the master chip and the slave chip are taken as an example, first and second chip select signals TOP1 and TOP2 are used.

Each of the first and second chip select signals TOP1 and TOP2 inputted to the signal transfer units 200A and 200B are inputted in an activated state to enable the corresponding signal transfer units when a semiconductor chip including the signal transfer unit is stacked at the uppermost layer among the plurality of semiconductor chips, or inputted in a deactivated state to disable the corresponding signal transfer unit when a semiconductor chip including the signal transfer unit is not stacked at the uppermost layer.

For example, a slave chip including the second signal transfer unit 200B may be stacked at the uppermost layer among the plurality of slave chips.

The second signal transfer unit 200B to which the activated second chip select signal TOP2 is inputted is enabled, and the first signal transfer unit 200A to which the deactivated first chip select signal TOP1 is inputted is disabled.

The first TSV 500A, which transfers a signal to the second signal transfer unit 200B included in the semiconductor chip stacked at the uppermost layer among the plurality of semiconductor chips, may include a plurality of TSVs, because the signal passes through the plurality of TSVs included in other semiconductor chips. Similarly, the second TSV 500B, which transfers a signal outputted from the second signal transfer unit 200B, may include a plurality of TSVs, because the signal passes through the plurality of TSVs included in other semiconductor chips.

The second controller 210A includes a third NAND gate ND3, a fourth inverter IV4, a fourth NAND gate ND4, a fifth inverter IV5, and a third NOR gate NR3. The third NAND gate ND3 is configured to perform a NAND operation on an output signal of the first node n1 and the first chip select signal TOP1. The fourth inverter IV4 is configured to invert and output an output signal of the third NAND gate ND3. The fourth NAND gate ND4 is configured to perform a NAND operation on an output signal of the fourth inverter IV4 and the first chip select signal TOP1. The fifth inverter IV5 is configured to invert and output the first chip select signal TOP1. The third NOR gate NR3 is configured to perform a NOR operation on an output signal of the fifth inverter IV5 and an output signal of the fourth inverter IV4.

The second driver 220A includes a third PMOS transistor P3 and a third NMOS transistor N3. The third PMOS transistor P3 is connected between the driving voltage terminal VDD and a third node n3 and configured to receive an output signal of the fourth NAND gate ND4. The third NMOS transistor N3 is connected between the third node n3 and the ground voltage VSS and configured to receive an output signal of the third NOR gate NR3.

When the activated second chip select signal TOP2 is inputted to the second signal transfer unit 200B, a signal inputted through the first TSV 500A from the signal path selection unit 100 is outputted to the third n3 through the second TSV 500B. Furthermore, the first chip select signal TOP1 inputted to the first signal transfer unit 200A included in the master chip is deactivated, at which point. the output signal of the first node n1 is not outputted to the third node n3 through the first signal transfer unit 200A. Therefore, the second chip select signal TOP2 enables the second signal transfer unit 220B of the slave chip, and the first chip select signal TOP1 disables the first signal transfer unit 200A of the master chip, thereby transferring the signal outputted from the signal path selection unit 100 through the TSVs.

The second signal transfer unit 200B includes a third controller 210B and a third driver 220B. The third controller 210B includes a tenth NAND gate ND10, a ninth inverter IV9, an eleventh NAND gate ND11, a tenth inverter IV10, and a fifth NOR gate NR5. The tenth NAND gate ND10 is configured to perform a NAND operation on the signal outputted from the first TSV 500A and the second select signal TOP2. The ninth inverter IV9 is configured to invert an output signal of the tenth NAND gate ND10. The eleventh NAND gate ND11 is configured to perform a NAND operation on an output signal of the ninth inverter IV9 and the second chip select signal TOP2. The tenth inverter IV10 is configured to invert the second chip select signal TOP2. The fifth NOR gate NR5 is configured to perform a NOR operation on an output signal of the tenth inverter IV10 and an output signal of the ninth inverter IV9. The third driver 220B includes a fifth PMOS transistor P5 and a fifth NMOS transistor N5. The fifth PMOS transistor P5 is connected between the driving voltage terminal VDD and a fourth node n4 and configured to receive an output signal of the eleventh NAND gate ND11. The fifth NMOS transistor N5 is connected between the fourth node n4 and the ground voltage VSS and configured to receive an output signal of the fifth NOR gate NR5.

The second signal transfer unit 200B outputs the output signal of the first node n1, received through the first TSV 500A, to the fourth node n4 in response to the second chip select signal TOP2. Since the fourth node n4 is connected to the second TSV 500B, an output signal of the fourth node n4 is transferred to the third node n3 and then inputted to the signal output unit 400.

The replica circuit unit 300 is configured to output the output signal of the second node n2 to the fifth node n5 in response to the control signal CTRL by modeling the second signal transfer unit 200B of the slave chip, and determines whether to transfer a signal in response to the control signal CTRL. The replica circuit unit 300 transfers a signal outputted from the signal transfer selection unit 100 to the signal output unit 400. Therefore, when the signal outputted from the first node n1 and outputted through the first TSV 500A, the second transfer unit 200B, and the second TSV 500B is compared to a signal outputted from the second node n2 and outputted through the replica circuit unit 300, it is possible to measure delay amounts of the first and second TSVs 500A and 500B.

The replica circuit unit 300 includes a fourth controller 310 and a fourth driver 320. The fourth controller 310 includes an eleventh inverter IV11, a fifth NAND gate ND5, a sixth inverter IV6, a fourth NOR gate NR4, a seventh inverter IV7, and a sixth NAND gate ND6. The eleventh inverter IV11 is configured to invert the control signal CTRL. The fifth NAND gate ND5 is configured to perform a NAND operation on the output signal of the second node n2 and an output signal of the eleventh inverter IV11. The sixth inverter IV6 is configured to invert the fifth NAND gate ND5. The fourth NOR gate NR4 is configured to perform a NOR operation on an output signal of the sixth inverter IV6 and the control signal CTRL. The seventh inverter IV7 is configured to invert the control signal CTRL. The sixth NAND gate ND6 is configured to perform a NAND operation on an output signal of the seventh inverter IV7 and the output signal of the sixth inverter IV6. The fourth driver 320 includes a fourth PMOS transistor P4 and a fourth NMOS transistor N4. The fourth PMOS transistor P4 is connected between the driving voltage terminal VDD and the fifth node n5 and configured to receive an output signal of the sixth NAND gate ND6. The fourth NMOS transistor N4 is connected between the fifth node n5 and the ground voltage VSS and configured to receive an output signal of the fourth NOR gate NR4.

When the control signal CTRL is activated, the replica circuit unit 300 does not transfer the output signal of the signal path selection unit 100 to the signal output unit 400. However, when the control signal CTRL is deactivated, the replica circuit unit 300 transfers the output signal of the signal path selection unit 100 to the signal output unit 400.

The signal output unit 400 is configured to receive the output signal of the third or fifth node n3 or n5 and output an output signal OUT in response to the control signal CTRL, receives the output signal of the third node n3 when the control signal CTRL is activated, and receives the output signal of the fifth node n5 to output the output signal OUT when the control signal CTRL is deactivated Therefore, the signal output unit 400 selectively outputs the signal outputted through the path of the first TSV 500A, the second signal transfer unit 200B, and the second TSV 500B from the first node n1 or the signal outputted through the replica circuit unit 300 from the second node n2, in response to the control signal CTRL.

Figure 3:
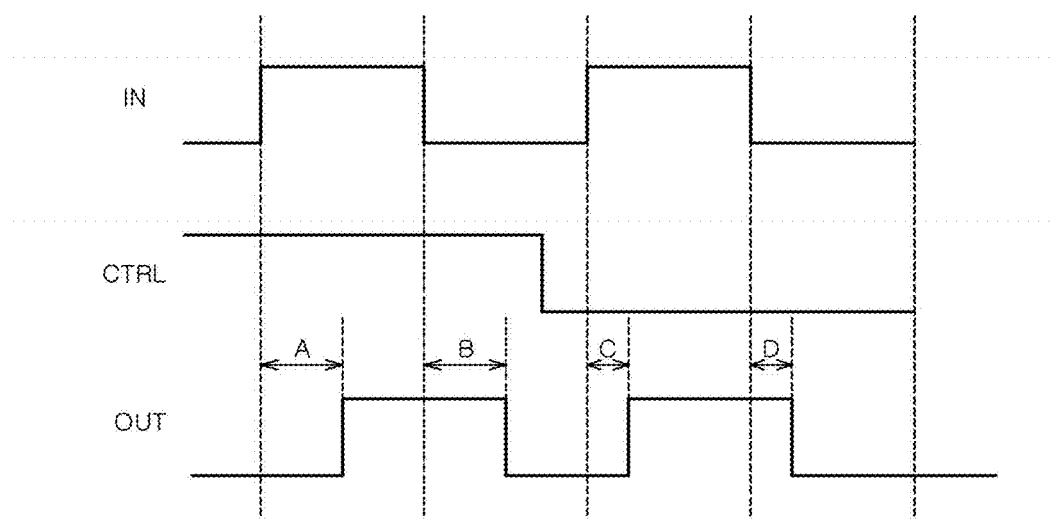
FIG. 3 is a timing diagram of the through-chip via delay measuring circuit according to an embodiment of the present invention.

FIG. 3 is a timing diagram of the through-chip via delay measuring circuit according to an embodiment of the present invention.

Referring to FIGS. 2 and 3, the operation of the through-chip via delay measuring circuit according to an embodiment of the present invention will be described as follows.

The input signal IN is a pulse signal having a predetermined cycle. When the signal path selection unit 100 receives the high-level input signal IN and the high-level control signal CTRL, the operation of the through-chip via delay measuring circuit is performed as follows.

When the high-level input signal IN and the high-level control signal CTRL are inputted to the first controller 110, the first NAND gate ND1 outputs a low level signal, the first NOR gate NR1 outputs a low level signal, the second NAND gate ND2 outputs a high level signal, and the second NOR gate NR2 outputs a low level signal. The first PMOS transistor P1 of the first driver 120 is turned on to drive the first node n1 to the driving voltage level VDD. Furthermore, the second PMOS transistor P2 and the first and second NMOS transistor N1 and N2 of the first driver 120 are turned off. Since the first PMOS transistor P1 of the first driver 120 is turned on and the first NMOS transistor N1 of the first driver 120 is turned off, the first node n1 is driven to a high level. Furthermore, no signal is outputted to the second node n2.

The first signal transfer unit 200A determines whether to output the high-level output signal of the first node n1 to the third node n3, in response to the first chip select signal TOP1.

Among the plurality of chip select signals, only a chip select signal inputted to the semiconductor chip stacked at the uppermost layer among the plurality of semiconductor chips has a high level, and the other chip select signals inputted to the other semiconductor chips have a low level. In this embodiment of the present invention, the first chip select signal TOP1 becomes a low level, and the second chip select signal TOP2 becomes a high level.

Referring back to FIG. 2, the first signal transfer unit 200A included in the master chip determines whether to output the high-level output signal of the first node n1 to the third node n3, in response to the low-level first chip select signal TOP1.

The second controller 210A receives the high-level output signal of the first node n1 and the low-level first chip select signal TOP1, and controls the fourth NAND gate ND4 and the third NOR gate NR3 to output a high-level signal and a low-level signal, respectively.

The third PMOS transistor P3 of the second driver 220A is turned off by receiving the high-level output signal of the fourth NAND gate ND4. Furthermore, the third NMOS transistor N3 of the second driver 220A is turned off by receiving the low-level output signal of the third NOR gate NR3. Therefore, the first signal transfer unit 200A does not transfer the output signal of the first node n1 to the third node n3.

The second signal transfer unit 200B determines whether to output the output signal of the first node n1, inputted through the first TSV 500A, to the fourth node n4 in response to the second chip select signal TOP2. The output signal from the fourth node n4 is inputted to the third node n3 through the second TSV 500B.

The third controller 210B of the second transfer unit 200B receives the high-level output signal of the first node n1, inputted through the first TSV 500A, and the high-level second chip select signal TOP2. The third controller 210B performs a logical operation on the high-level output signal of the first node n1 and the high-level second chip select signal TOP2, and outputs low-level signals to the eleventh ND11 and the fifth NOR gates NR5, respectively. The fifth PMOS transistor P5 of the third driver 220B is turned on to drive the fourth node n4 to the driving voltage level VDD. Furthermore, the fifth NMOS transistor N5 is turned off. Therefore, since the fifth PMOS transistor P5 of the third driver 220B is turned on and the fifth NMOS transistor N5 of the third driver 220B is turned off, the fourth node n4 is driven to a high level.

The signal output unit 400 receives the output signal of the third or fifth node n3 or n5 and outputs the output signal OUT in response to the control signal CTRL. The output signal of the fourth node n4 is transferred to the third node n3 through the second TSV 500B. The signal output unit 400 receives the high-level output signal of the third node n3.

The signal output unit 400 includes a seventh NAND gate ND7, an eighth inverter IV8, an eighth NAND gate ND8, and a ninth NAND gate ND9. The seventh NAND gate ND7 is configured to perform a NAND gate on the output signal of the third node n3 and the control signal CTRL. The eighth inverter IV8 is configured to invert the control signal CTRL. The eighth NAND gate ND8 is configured to perform a NAND operation on an output signal of the eighth inverter IV8 and the output signal of the fifth node n5. The ninth NAND gate ND9 is configured to perform a NAND operation on an output signal of the seventh NAND gate ND7 and an output signal of the eighth NAND gate ND8.

The seventh NAND gate ND7 performs a logical operation on the high-level output signal of the third node n3 and the high-level control signal CTRL, and outputs a low level signal. The ninth NAND gate ND9 outputs the high-level output signal OUT in response to the low-level output signal of the seventh NAND gate ND7.

When the output signal OUT outputted from the signal output unit 400 is compared to the input signal IN, the output signal OUT is delayed by a first delay amount A from the input signal IN.

The first delay amount A is a delay amount which is generated by the first TSV 500A, the second signal transfer unit 200B, and the second TSV 500B when the input signal IN transits from a low level to a high level.

When the signal path selection unit 100 receives the low-level input signal IN and the high-level control signal CTRL, the operation of the through-chip via delay measuring circuit is performed as follows.

When the low-level input signal IN and the high-level control signal CTRL are inputted to the first controller 110, the first NAND gate ND1 outputs a high level signal, the first NOR gate NR1 outputs a high level signal, the second NAND gate ND2 outputs a high level signal, and the second NOR gate NR2 outputs a high level signal. The first NMOS transistor N1 of the first driver 120 is turned on to pull down the first node n1 to the ground voltage level VSS. Since the first NMOS transistor N1 of the first driver 120 is turned on and the first PMOS transistor P1 of the first driver 120 is turned off, the first node n1 is driven to a low level.

Furthermore, the second PMOS transistor P2 is turned off, and the second NMOS transistor N2 is turned on to pull down the second node n2 to the ground voltage level VSS. Therefore, since the second NMOS transistor N2 of the first driver 120 is turned on and the second PMOS transistor P2 of the first driver 120 is turned off, the second node n2 is driven to a low level.

The first signal transfer unit 200A determines whether to output the low-level output signal of the first node n1 to the third node n3, in response to the first chip select signal TOP1. The first signal transfer unit 200A included in the master chip determines whether to output the low-level output signal of the first node n1 to the third node n3, in response to the low-level first chip select signal TOP1.

The second control unit 210A receives the low-level output signal of the first node n1 and the low-level first chip select signal TOP1, and controls the fourth NAND gate ND4 and the third NOR gate NR3 to output a high level signal and a low level signal, respectively.

The third PMOS transistor P3 of the second driver 220A is turned off by receiving the high-level output signal of the fourth NAND gate ND4. Furthermore, the third NMOS transistor N3 of the second driver 220A is turned off by receiving the low-level output signal of the third NOR gate NR3. Therefore, the first signal transfer unit 200A does not transfer the output signal of the first node n1 to the third node n3.

The fourth controller 310 of the replica circuit 300 receives the low-level output signal of the second node n2 and the high-level control signal CTRL, and controls the sixth NAND gate ND6 and the fourth NOR gate NR4 to output a high level signal and a low level signal, respectively.

The fourth PMOS transistor P4 of the fourth driver 320 is turned off by receiving the high-level output signal of the sixth NAND gate ND6. Furthermore, the fourth NMOS transistor N4 of the fourth driver 320 is turned off by receiving the low-level output signal of the fourth NOR gate NR4, preventing the replica circuit 300 from transferring the output signal of the second node n2 to the fifth node n5.

The second signal transfer unit 200B determines whether to output the output signal of the first node n1, inputted through the first TSV 500A, to the fourth node n4 in response to the second chip select signal TOP2. The output signal from the fourth node n4 is inputted to the third node n3 through the second TSV 500B.

The third control unit 210B of the second signal transfer unit 200B receives the low-level output signal of the first node n1, inputted through the first TSV 500A, and the high-level second chip select signal TOP2, and performs a logical operation on the low-level output signal of the first node n1 and the high-level second chip select signal TOP2, and outputs high level signals to the fifth NAND gate ND11 and the fifth NOR gate NR5, respectively. The fifth NMOS transistor N5 of the third driver 220B is turned on to pull down the fourth node n4 to the ground voltage level VSS, and the fifth PMOS transistor P5 is turned off, thereby driving the fourth node n4 to a low level.

The signal output unit 400 receives the output signal of the third or fifth node n3 or n5, and outputs the output signal OUT in response to the control signal CTRL. The output signal of the fourth node n4 is transferred to the third node n3 through the second TSV 500B. The signal output unit 400 receives the low-level output signal of the third node n3.

The signal output unit 400 includes the seventh NAND gate ND7 configured to perform the output signal of the third node n3 and the control signal CTRL, the eighth inverter IV8 configured to invert the control signal CTRL, the eighth NAND gate ND8 configured to perform a NAND operation on an output signal of the eighth inverter IV8 and the output signal of the fifth node n5, and the ninth NAND gate ND9 configured to perform a NAND operation on an output signal of the seventh NAND gate ND7 and an output signal of the eighth NAND gate ND8.

The seventh NAND gate ND7 performs a NAND operation on the low-level output signal of the third node n3 and the high-level control signal CTRL, and outputs a high level signal. The eighth NAND gate ND8 receives the low-level control signal CTRL inverted by the eighth inverter IV8, and outputs a high level signal. The ninth NAND gate ND9 outputs the output signal OUT in response to the high-level output signal of the seventh NAND gate ND7 and the high-level output signal of the eighth NAND gate ND8.

When the output signal OUT outputted from the signal output unit 400 is compared to the input signal IN, the output signal OUT is delayed by a second delay amount B from the input signal IN, which is a delay amount generated by the first TSV 500A, the second signal transfer unit 200B, and the second TSV 500B when the input signal IN transits from a high level to a low level.

When the signal path selection unit 100 receives the high-level input signal IN and the low-level control signal CTRL, the operation of the through-chip via delay measuring circuit is performed as follows.

When the high-level input signal IN and the low-level control signal CTRL are inputted to the first controller 110, the first NAND gate ND1 outputs a high level signal, the first NOR gate NR1 outputs a low level signal, the second NAND gate ND2 outputs a low level signal, the second NOR gate NR2 outputs a low level signal, and the second PMOS transistor P2 of the first driver 120 is turned on to drive the second node n2 to the driving voltage level VDD. Therefore, since the second PMOS transistor P2 of the first driver 120 is turned on and the second NMOS transistor N2 of the first driver 120 is turned off, the second node n2 is driven to a high level.

Since the first PMOS transistor P1 and the first NMOS transistor N1 are turned off, the signal path selection unit 100 does not output a signal to the first node n1.

The fourth controller 310 of the replica circuit unit 300 receives the high-level output signal of the second node n2 and the low-level control signal CTRL, and controls the sixth NAND gate ND6 and the fourth NOR gate NR4 to output low level signals, respectively.

The fourth NMOS transistor P4 of the fourth driver 320 is turned on by receiving the low-level output signal of the sixth NAND gate ND6, and drives the fifth node n5 to the driving voltage level VDD. The fourth NMOS transistor N4 of the fourth driver 320 is turned off by receiving the low-level output signal of the fourth NOR gate NR4. Therefore, since the fourth PMOS transistor P4 of the fourth driver 320 is turned on and the fourth NMOS transistor N4 of the fourth driver 320 is turned off, the fifth node n5 is driven to a high level.

The signal output unit 400 includes the seventh NAND gate ND7 configured to perform the output signal of the third node n3 and the control signal CTRL, the eighth inverter IV8 configured to invert the control signal CTRL, the eighth NAND gate ND8 configured to perform a NAND operation on an output signal of the eighth inverter IV8 and the output signal of the fifth node n5, and the ninth NAND gate ND9 configured to perform a NAND operation on an output signal of the seventh NAND gate ND7 and an output signal of the eighth NAND gate ND8.

The seventh NAND gate ND7 performs a NAND operation on the output signal of the third node n3 and the low-level control signal CTRL, and outputs a high level signal. The eighth inverter IV8 inverts and outputs the low-level control signal CTRL. The eighth NAND gate ND8 performs a NAND operation on an output signal of the eighth inverter IV8 and the high-level output signal of the fifth node n5, and outputs a low level signal. The ninth NAND gate ND9 outputs the high-level output signal OUT in response to the high-level output signal of the seventh NAND gate ND7 and the low-level output signal of the eighth NAND gate ND8.

When the output signal OUT outputted from the signal output unit 400 is compared to the input signal IN, the output signal OUT is delayed by a third delay amount C from the input signal IN, which is a delay amount of the input signal IN passing through the replica circuit unit 300, when the input signal IN transits from a low level to a high level. Since the replica circuit unit 300 is a circuit configured by modeling the second signal transfer unit 200B, the third delay amount C corresponds to a delay amount generated by the second signal transfer unit 200B.

When the signal path selection unit 100 receives the low-level input signal IN and the low-level control signal CTRL, the operation of the through-chip via delay measuring circuit is performed as follows.

When the low-level input signal IN and the low-level control signal CTRL are inputted to the first controller 110, the first NAND gate ND1 outputs a high level signal, the first NOR gate NR1 outputs a low level signal, the second NAND gate ND2 outputs a high level signal, the second NOR gate NR2 outputs a low level signal, the first PMOS transistor P1, the second PMOS transistor P2, the first NMOS transistor N1, and the second NMOS transistor N2 of the first driver 120 are turned off, and do not output a signal to the first or second node n1 or n2. The output signal OUT becomes a high level signal delayed by a fourth delay amount D from the input signal IN.

In other words, when the input signal IN transits from a high level to a low level in a state where the control signal CTRL is at a low level, the signal output unit 400 outputs the low-level output signal OUT delayed by the fourth delay amount D.

The fourth delay amount D is a delay amount of the input signal IN passing through the replica circuit unit 300, when the input signal IN transits from a high level to a low level. Since the replica circuit unit 300 is a circuit configured by modeling the second signal transfer unit 200B, the fourth delay amount D corresponds to a delay amount generated by the second signal transfer unit 200B.

Specifically, the first delay amount A is a delay amount which is generated by the first TSV 500A, the second signal transfer unit 200B, and the second TSV 500B when the input signal IN transits from a low level to a high level, and the third delay amount C is a delay amount of the input signal IN passing through the replica circuit unit 300 when the input signal IN transits from a low level to a high level. Since the replica circuit unit 300 is a circuit configured by modeling the second signal transfer unit 200B, the third delay amount C corresponds to a delay amount generated by the second signal transfer unit 200B. Therefore, when the third delay amount C is subtracted from the first delay amount A, it is possible to measure a delay amount caused by the first and second TSVs 500A and 500B when the input signal IN transits from a low level to a high level.

The second delay amount B is a delay amount which is generated by the first TSV 500A, the second signal transfer unit 200B, and the second TSV 500B when the input signal IN transits from a high level to a low level, and the fourth delay amount D is a delay amount of the input signal IN passing through the replica circuit unit 300 when the input signal IN transits from a high level to a low level. Since the replica circuit unit 300 is a circuit configured by modeling the second signal transfer unit 200B, the fourth delay amount D corresponds to a delay amount generated by the second signal transfer unit 200B. Therefore, when the fourth delay amount D is subtracted from the second delay amount B, it is possible to measure a delay amount caused by the first and second TSVs 500A and 500B when the input signal IN transits from a high level to a low level.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   a slave chip comprising a signal transfer unit configured to determine whether to transfer an input signal in response to a chip select signal;
   a master chip comprising a replica circuit unit having a similar configuration as the signal transfer unit and a signal output unit configured to receive an output signal of the signal transfer unit and an output signal of the replica circuit unit and generate an output signal in response to a control signal by selecting one of the output signal of the signal transfer unit and the output signal of the replica circuit unit;
   a first through-chip via vertically formed through the slave chip, and having one end connected to the master chip to receive the input signal and the other end connected to the signal transfer unit; and
   a second through-chip via vertically formed through the slave chip, and having one end connected to the signal transfer unit and the other end connected to the signal output unit.

2. The semiconductor apparatus according to claim 1, wherein the signal output unit outputs a signal outputted from the signal transfer unit as the output signal when the control signal is activated, and outputs a signal outputted from the replica circuit unit as the output signal when the control signal is deactivated.

3. The semiconductor apparatus according to claim 1, wherein the replica circuit unit determines whether to transfer the input signal in response to the control signal.

4. The semiconductor apparatus according to claim 3, wherein the replica circuit unit transfers the input signal to the signal output unit when the control signal is deactivated.

5. The semiconductor apparatus according to claim 1, wherein the input signal comprises a pulse signal having a predetermined cycle.

6. The semiconductor apparatus according to claim 1, wherein the chip select signal is activated when the slave chip is stacked at the uppermost layer among a plurality of stacked semiconductor chips.

7. The semiconductor apparatus according to claim 1, wherein the chip select signal is activated when the slave chip is stacked at the uppermost layer among a plurality of stacked semiconductor chips.

8. A semiconductor apparatus comprising:
   a slave chip comprising having a signal transfer unit configured to determine whether to transfer an input signal in response to a chip select signal;
   a master chip comprising a replica circuit unit having a similar configuration as the signal transfer unit, a signal path selection unit configured to transmit the input signal to the signal transfer unit or the replica circuit unit in response to a control signal, and a signal output unit configured to receive an output signal of the signal transfer unit and an output signal of the replica circuit unit and output an output signal in response to the control signal;
   a first through-chip via vertically formed through the slave chip, and having one end connected to the signal path selection unit and the other end connected to the signal transfer unit; and
   a second through-chip via vertically formed through the slave chip, and having one end connected to the signal transfer unit and is the other end connected to the signal output unit.

9. The semiconductor apparatus according to claim 8, wherein the signal path selection unit transmits the input signal to the signal transfer unit when the control signal is activated, and transmits the input signal to the replica circuit unit when the control signal is deactivated.

10. The semiconductor apparatus according to claim 8, wherein the signal output unit outputs a signal outputted from the signal transfer unit as the output signal when the control signal is activated, and outputs a signal outputted from the replica circuit unit as the output signal when the control signal is deactivated.

11. The semiconductor apparatus according to claim 8, wherein the replica circuit unit determines whether to transmit the input signal in response to the control signal.

12. The semiconductor apparatus according to claim 11, wherein the replica circuit unit transmits the input signal to the signal output unit when the control signal is deactivated.

13. The semiconductor apparatus according to claim 8, wherein the control signal comprises a test mode signal.

14. The semiconductor apparatus according to claim 8, wherein the input signal comprises a pulse signal having a predetermined cycle.

15. The semiconductor apparatus according to claim 8, wherein the chip select signal is activated when the slave chip is stacked at the uppermost layer among a plurality of stacked semiconductor chips.

* * * * *